(12) United States Patent
Tsai et al.

(10) Patent No.: US 10,818,719 B2
(45) Date of Patent: *Oct. 27, 2020

(54) SEMICONDUCTOR DEVICE WITH A RADIATION SENSING REGION AND METHOD FOR FORMING THE SAME

(71) Applicant: Taiwan Semiconductor Manufacturing Company, Ltd., Hsinchu (TW)

(72) Inventors: Tsung-Han Tsai, Zhunan Township (TW); Yun-Wei Cheng, Taipei (TW); Kuo-Cheng Lee, Tainan (TW); Chun-Hao Chou, Tainan (TW); Yung-Lung Hsu, Tainan (TW)

(73) Assignee: Taiwan Semicondutor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/578,972

(22) Filed: Sep. 23, 2019

(65) Prior Publication Data

US 2020/0020725 A1 Jan. 16, 2020

Related U.S. Application Data

(63) Continuation of application No. 15/845,919, filed on Dec. 18, 2017, now Pat. No. 10,475,839, which is a continuation of application No. 15/171,959, filed on Jun. 2, 2016, now Pat. No. 9,847,363.

(60) Provisional application No. 62/243,904, filed on Oct. 20, 2015.

(51) Int. Cl.
*H01L 27/146* (2006.01)

(52) U.S. Cl.
CPC ...... *H01L 27/1463* (2013.01); *H01L 27/1462* (2013.01); *H01L 27/1464* (2013.01); *H01L 27/14654* (2013.01); *H01L 27/14685* (2013.01); *H01L 27/14689* (2013.01); *H01L 27/14636* (2013.01)

(58) Field of Classification Search
None
See application file for complete search history.

(56) References Cited

U.S. PATENT DOCUMENTS

| | | | |
|---|---|---|---|
| 7,521,278 B2 | 4/2009 | Fujita | |
| 8,476,685 B2 | 7/2013 | Lee | |
| 9,847,363 B2 * | 12/2017 | Tsai | H01L 27/1463 |
| 2002/0031890 A1 | 3/2002 | Watanabe et al. | |
| 2005/0151218 A1 | 7/2005 | Mouli | |
| 2005/0184291 A1 | 8/2005 | Cole et al. | |

(Continued)

FOREIGN PATENT DOCUMENTS

| | | |
|---|---|---|
| CN | 101847643 A | 9/2010 |
| JP | 2013251539 A | 12/2013 |

(Continued)

*Primary Examiner* — Herve-Louis Y Assouman
(74) *Attorney, Agent, or Firm* — Slater Matsil, LLP

(57) ABSTRACT

A semiconductor device includes a semiconductor substrate, a radiation-sensing region, at least one isolation structure, and a doped passivation layer. The radiation-sensing region is present in the semiconductor substrate. The isolation structure is present in the semiconductor substrate and adjacent to the radiation-sensing region. The doped passivation layer at least partially surrounds the isolation structure in a substantially conformal manner.

20 Claims, 8 Drawing Sheets

(56) References Cited

U.S. PATENT DOCUMENTS

| | | |
|---|---|---|
| 2007/0045684 A1 | 3/2007 | Lee |
| 2008/0217719 A1* | 9/2008 | Liu .................... H01L 27/1463 |
| | | 257/446 |
| 2009/0020845 A1 | 1/2009 | Shin et al. |
| 2009/0200590 A1 | 8/2009 | Mao et al. |
| 2010/0019295 A1 | 1/2010 | Henderson et al. |
| 2010/0110239 A1 | 5/2010 | Ramappa et al. |
| 2010/0140668 A1 | 6/2010 | Stevens |
| 2010/0224947 A1 | 9/2010 | Hynecek |
| 2010/0237451 A1 | 9/2010 | Murakoshi |
| 2011/0241152 A1 | 10/2011 | Hsiao et al. |
| 2012/0080733 A1 | 4/2012 | Doan et al. |
| 2012/0133011 A1 | 5/2012 | Ueno et al. |
| 2012/0292735 A1 | 11/2012 | Tan et al. |
| 2013/0113061 A1 | 5/2013 | Lai et al. |
| 2013/0134535 A1 | 5/2013 | Lenchenkov |
| 2013/0285130 A1* | 10/2013 | Ting .................... H01L 27/1464 |
| | | 257/291 |
| 2013/0323875 A1 | 12/2013 | Park et al. |
| 2014/0120653 A1* | 5/2014 | Zhao .................... H01L 31/0232 |
| | | 438/70 |
| 2014/0374867 A1 | 12/2014 | De Munck et al. |
| 2015/0243694 A1 | 8/2015 | Ihara |
| 2015/0340391 A1 | 11/2015 | Webster |
| 2016/0079288 A1 | 3/2016 | Choi et al. |
| 2016/0225812 A1 | 8/2016 | Elkhatib et al. |
| 2017/0110494 A1 | 4/2017 | Tsai et al. |
| 2018/0122843 A1 | 5/2018 | Tsai et al. |

FOREIGN PATENT DOCUMENTS

| | | |
|---|---|---|
| KR | 20130050867 A | 5/2013 |
| TW | 200832691 A | 8/2008 |

* cited by examiner

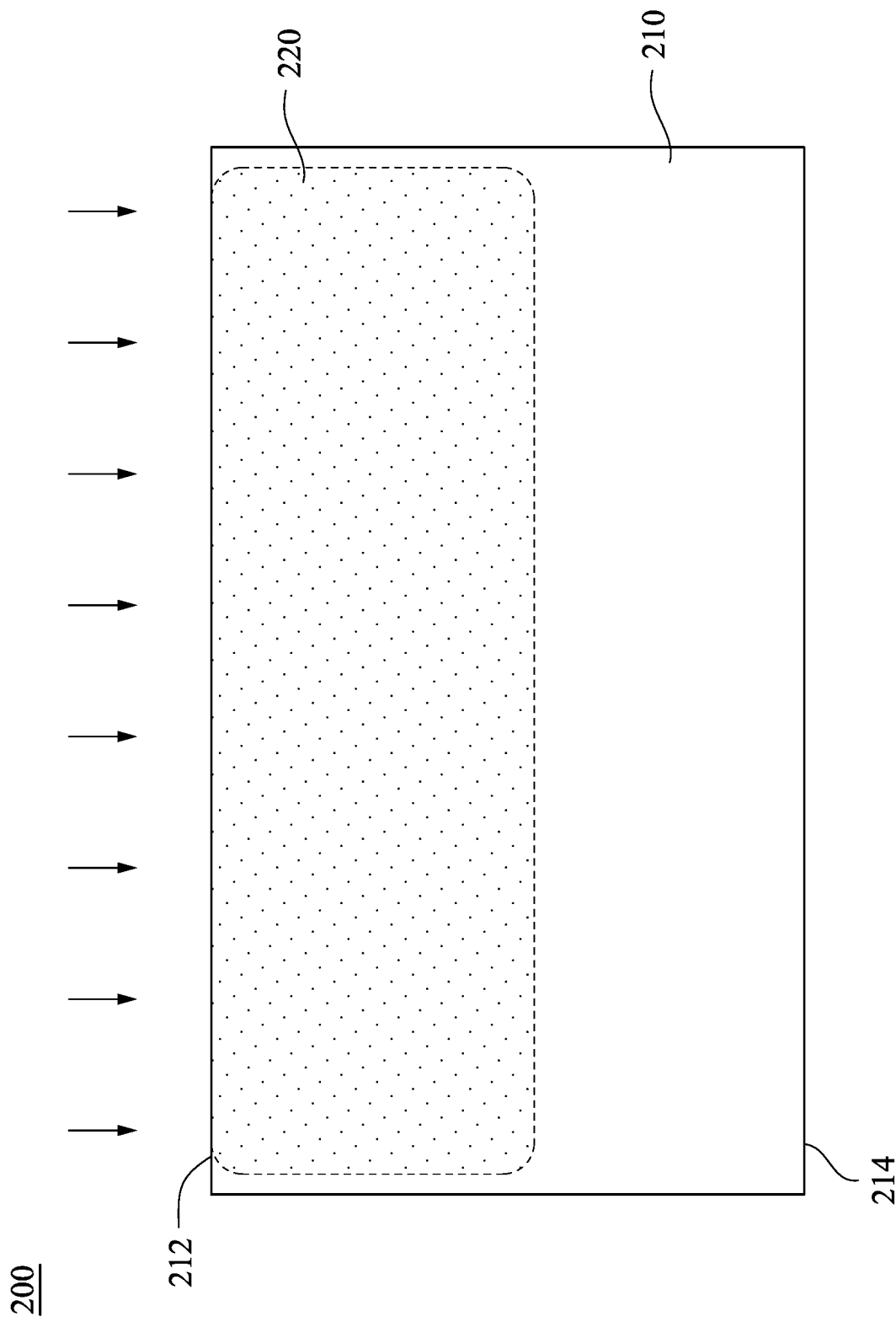

US 10,818,719 B2

SEMICONDUCTOR DEVICE WITH A RADIATION SENSING REGION AND METHOD FOR FORMING THE SAME

PRIORITY CLAIM AND CROSS-REFERENCE

This application is a continuation of U.S. patent application Ser. No. 15/845,919, entitled "Semiconductor Device with a Radiation Sensing Region and Method of Forming the Same," filed Dec. 18, 2017, which is a continuation of U.S. patent application Ser. No. 15/171,959, entitled "Semiconductor Device with a Radiation Sensing Region and Method of Forming the Same," filed Jun. 2, 2016, now U.S. Pat. No. 9,847,363, issued Dec. 19, 2017, which application claims priority to U.S. Provisional Application No. 62/243,904, filed Oct. 20, 2015, which applications are herein incorporated by reference.

BACKGROUND

An image sensor is a sensor that detects and conveys the information that constitutes an image. Complementary metal-oxide-semiconductor (CMOS) image sensors (CIS) are used in various applications such as digital still camera or mobile phone camera applications. These devices utilize an array of pixels in a substrate, including photodiodes and transistors that can absorb radiation projected toward the substrate and convert the sensed radiation into electrical signals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to FIG. 2F are cross-sectional views of a semiconductor device at plural intermediate stages of a formation method according to some embodiments of the present disclosure.

DETAILED DESCRIPTION

Figure 1:
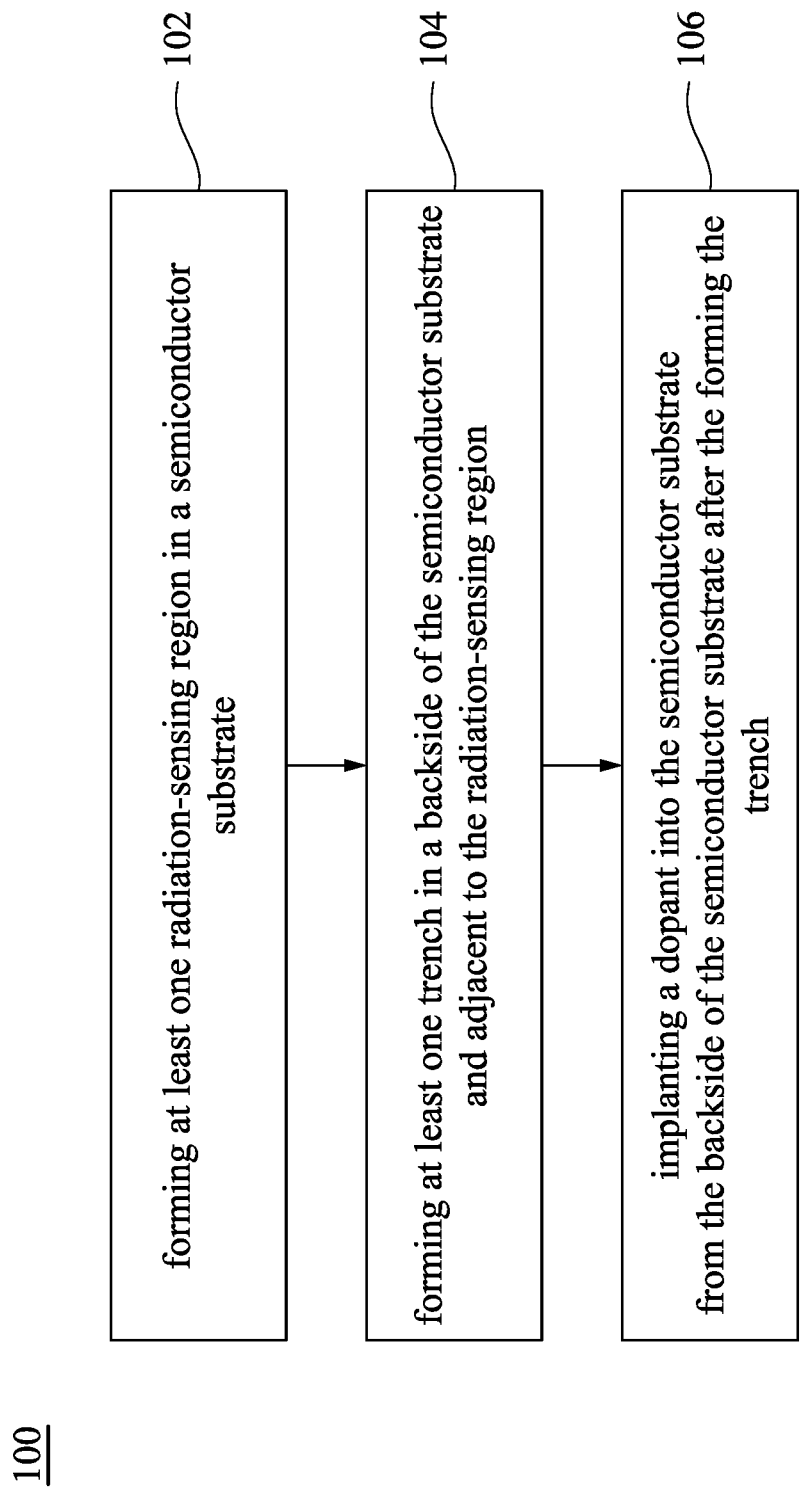
FIG. 1 is a flow chart of a method for forming a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart of a method 100 for forming a semiconductor device according to some embodiments of the present disclosure. FIGS. 2A-2F are cross-sectional views of a semiconductor device 200 at plural intermediate stages of a formation method in accordance with some embodiments of the present disclosure. It is understood that additional steps may be implemented before, during, and after the method, and some of the steps described may be replaced or eliminated for other embodiments of the method. The semiconductor device 200 and the method 100 making the same are collectively described with reference to various figures.

Referring to FIG. 1 and FIG. 2A, the method 100 begins with block 102 by forming a radiation-sensing region 220 within a frontside 212 of a semiconductor substrate 210. The semiconductor substrate 210 has the frontside 212 and a backside 214. The frontside 212 may also be referred to as a front surface, and the backside 214 may also be referred to as a back surface. In some embodiments of the present disclosure, the finished semiconductor device may be a photosensitive device, such as an image sensor device. For the finished semiconductor device, the backside 214 of the semiconductor substrate 210 is designed to receive the incident light. Therefore, the finished semiconductor device may be referred to as a backside illuminated image sensor, such as a backside illuminated (BSI) complementary metal-oxide semiconductor image sensor (CIS).

The semiconductor substrate 210 is made of a semiconductor material, such as silicon. In some embodiments, the semiconductor substrate 210 may be a silicon substrate doped with P-type dopants such as boron, in which case the semiconductor substrate 210 is a P-type substrate. Alternatively, the semiconductor substrate 210 may be another suitable semiconductor material. For example, the semiconductor substrate 210 may be a silicon substrate that is doped with N-type dopants such as phosphorous, arsenic, or antimony, in which case the semiconductor substrate 210 is an N-type substrate. The semiconductor substrate 210 may include other elementary semiconductors such as germanium and diamond. The semiconductor substrate 210 may optionally include a compound semiconductor and/or an alloy semiconductor. Furthermore, the semiconductor substrate 210 may include an epitaxial layer (epi layer), may be strained for performance enhancement, and may include a silicon-on-insulator (SOI) structure.

The radiation-sensing region 220 may be doped regions having first dopants formed in the semiconductor substrate 210 by a method such as diffusion or ion implantation on the semiconductor substrate 210. To be specific, the semiconductor substrate 210 is implanted with the first dopants from the frontside 212 to form the radiation-sensing region 220. In some embodiments, the radiation-sensing region 220 may be formed by performing a plurality of ion implantation processes on the semiconductor substrate 210 through the frontside 212. The radiation-sensing region 220 is formed by multiple implantation processes using various dopants, implant dosages, and implant energies. The implantation processes may also use different masks that have different patterns and opening sizes. For example, N+ implants, array-N-well implants, and deep-array-N-well implants may be performed.

Herein, the ion implantation process implants the semiconductor substrate 210 with first dopants having an opposite doping polarity as the semiconductor substrate 210. For example, in some embodiments where the semiconductor substrate 210 is a P-type substrate, the radiation-sensing region 220 is doped with N-type dopants. In some embodiments where the semiconductor substrate 210 is an N-type substrate, the radiation-sensing region 220 is doped with P-type dopants.

In FIG. 2A, the radiation-sensing region 220 is formed adjacent to or near the frontside 212 of the semiconductor substrate 210. In alternative embodiments, depending on the design needs and manufacturing requirements, the radiation-sensing region 220 may be formed further away from the frontside 212. The position or location of the radiation-sensing region 220 may be adjusted by tuning an implantation energy level of the implantation process used to form the radiation-sensing region 220. In some embodiments, a higher implantation energy level results in a deeper implant, which means the radiation-sensing region 220 are formed further away from the frontside 212. Similarly, a smaller implantation energy level causes the radiation-sensing region 220 to be formed closer to the frontside 212.

Figure 2B:
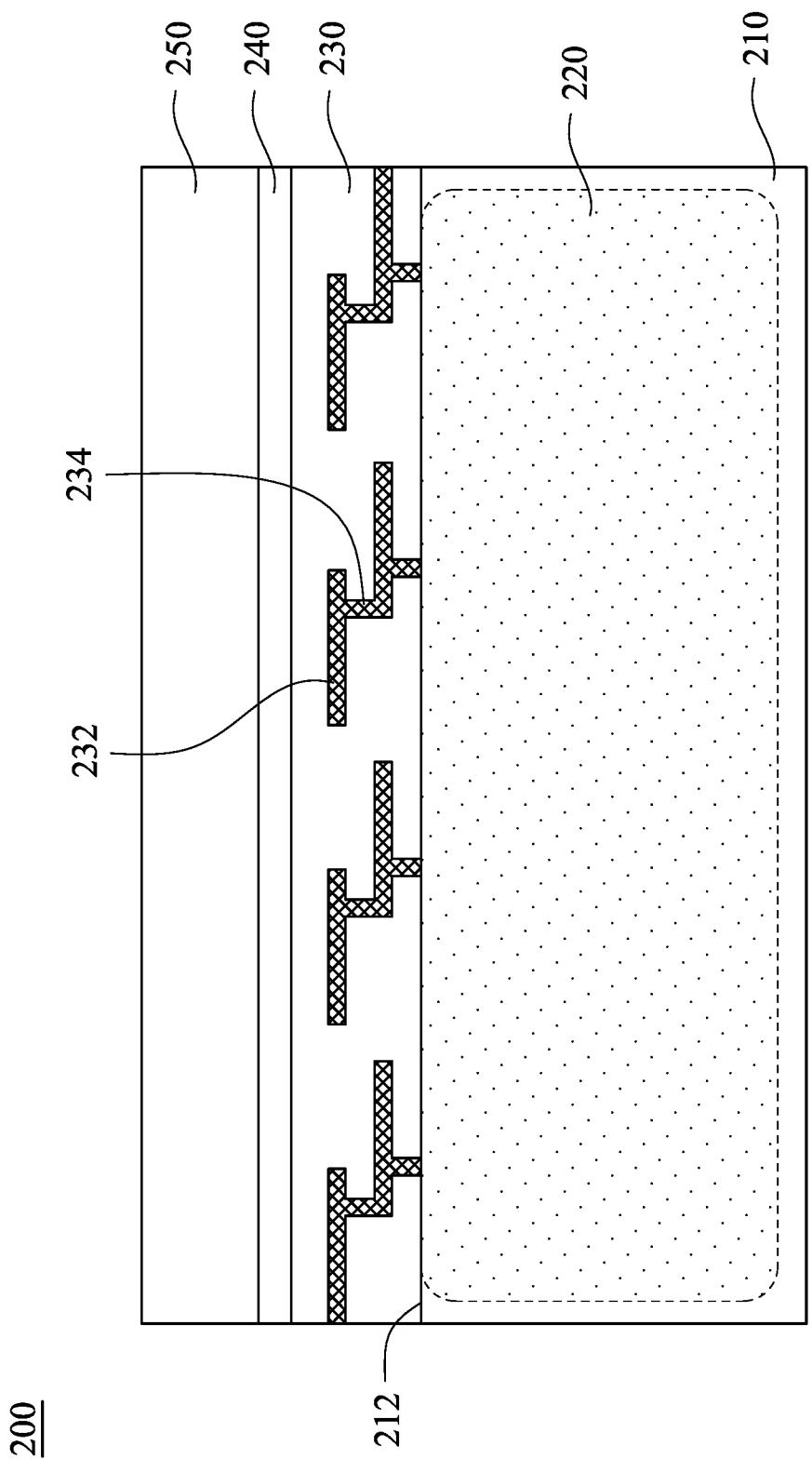

FIG. 2B illustrating the formation of a interconnect structure 230 and a buffer layer 240. In some embodiments, the interconnect structure 230 is formed over the frontside 212 of the semiconductor substrate 210. The interconnection structure 230 includes a number of patterned dielectric layers and conductive layers that couple to various doped features, circuitry, and input/output of the radiation-sensing region 220. The interconnection structure 230 includes an interlayer dielectric (ILD) and a multilayer interconnection (MLI) structure. The MLI structure includes contacts, vias and metal lines. For the purpose of illustration, a number of conductive lines 232 and vias/contacts 234 are shown in FIG. 2. It being understood that the conductive lines 232 and vias/contacts 234 are exemplary. The actual positioning and configuration of the conductive lines 232 and vias/contacts 234 may vary depending on design needs and manufacturing concerns.

In some embodiments, the MLI structure may include conductive materials such as aluminum, aluminum/silicon/copper alloy, titanium, titanium nitride, tungsten, polysilicon, metal silicide, or combinations thereof, being referred to as aluminum interconnects. Other manufacturing techniques to form the aluminum interconnect may include photolithography processing and etching to pattern the conductive materials for vertical connection (via and contact) and horizontal connection (conductive line). Alternatively, copper multilayer interconnects may be used to form the metal patterns. The copper multilayer interconnects may include copper, copper alloy, titanium, titanium nitride, tantalum, tantalum nitride, tungsten, polysilicon, metal silicide, or combinations thereof. The copper multilayer interconnects may be formed by a technique including chemical vapor deposition (CVD), sputtering, plating, or other suitable processes.

The buffer layer 240 is formed on the interconnect structure 230. In some embodiments of the present disclosure, the buffer layer 240 includes a dielectric material, such as silicon oxide. Alternatively, the buffer layer 240 may optionally include silicon nitride. The buffer layer 240 is formed by CVD, physical vapor deposition (PVD), or other suitable techniques. The buffer layer 240 is planarized to form a smooth surface by a chemical-mechanical-polishing (CMP) process.

In some embodiments of the present disclosure, a carrier substrate 250 is then bonded with the buffer layer 240 so that processing of the backside 214 of the semiconductor substrate 210 can be performed. The carrier substrate 250 is bonded to the buffer layer 240 by molecular forces. The carrier substrate 250 may be similar to the semiconductor substrate 210 and includes a silicon material. Alternatively, the carrier substrate 250 may optionally include a glass substrate. The carrier substrate 250 provides protection for the various features formed on the frontside 212 of the semiconductor substrate 210. The carrier substrate 250 also provides mechanical strength and support for processing the backside 214 of the semiconductor substrate 210, which will be discussed below. An annealing process may optionally be performed to enhance bonding strength. The buffer layer 240 provides electrical isolation between the interconnect structure 230 on the semiconductor substrate 210 and the carrier substrate 250.

Thereafter, a thinning process (also referred to as a thin down process) may be optionally performed to thin the semiconductor substrate 210 from the backside 214, such that the distance between the radiation-sensing region 220 and the backside 214 of the thinned semiconductor substrate 210 is reduced. In some embodiments, the thinning process includes a CMP process. The thinning process may also include a diamond scrubbing process, a grinding process, or other suitable techniques. In some embodiments, the thinning process is performed until reaching the radiation-sensing region 220. Alternatively, in some embodiments, a strengthened and thin semiconductor substrate 210 may be adopted and provides mechanical strength and support for the previous process, such as the formation of the interconnect structure 230 or the deposition of the buffer layer 140, and in this case the thinning process may be omitted.

Figure 2C:
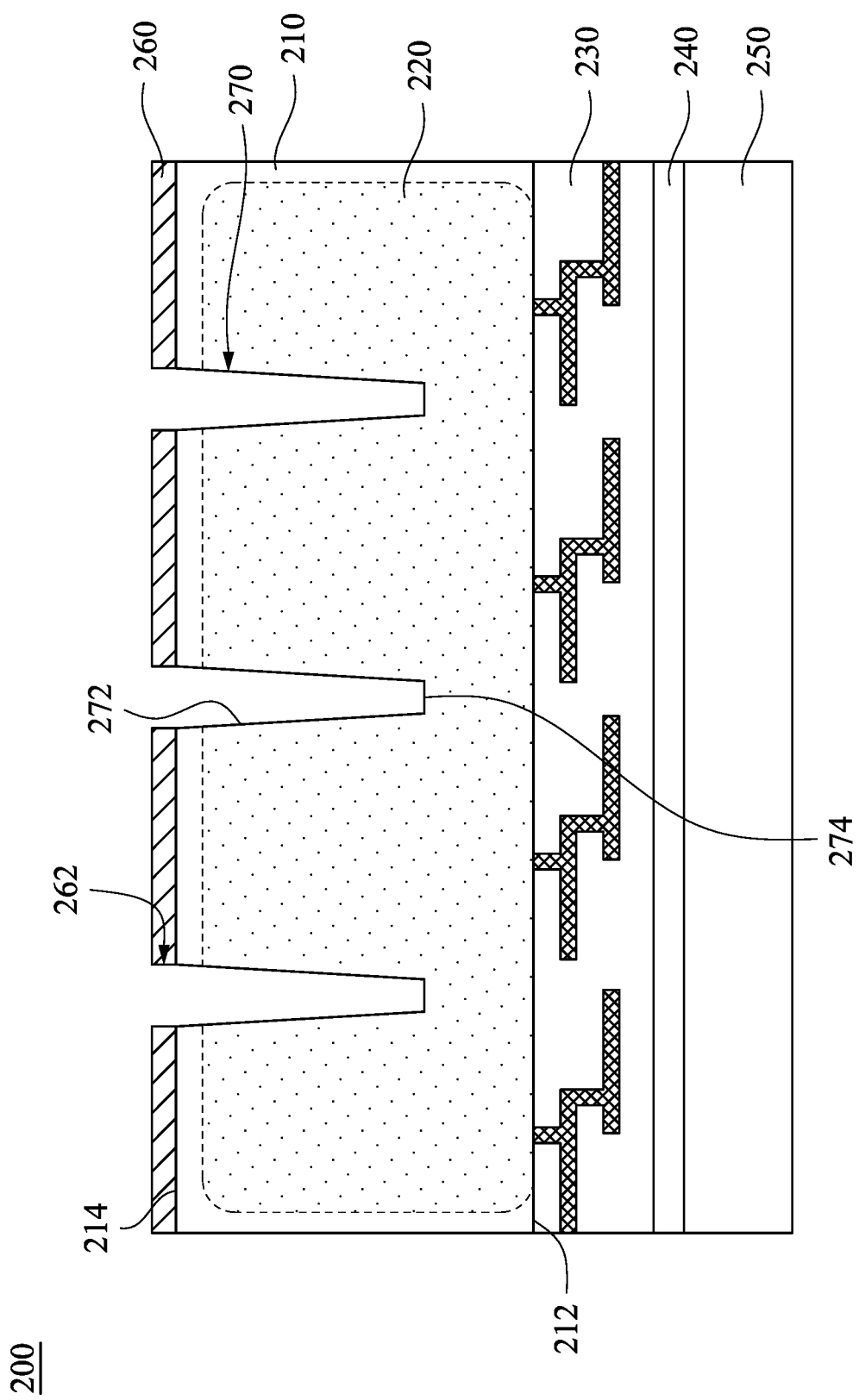

FIG. 2C illustrating the formation of a patterned hard mask layer 260 over the backside 214 of the semiconductor substrate 210. The patterned hard mask layer 260 may be formed by first forming a hard mask material over the backside 214 using a deposition process, such as a chemical vapor deposition (CVD) process, a physical vapor deposition (PVD) process, or an atomic layer deposition (ALD) process. The hard mask material is then patterned in a photolithography process that may involve a photoresist material (not illustrated) and various exposure, developing, baking, stripping, and etching processes. As a result, the patterned hard mask layer 260 having openings 262 therein is formed.

Reference is made to FIG. 1 and FIG. 2C. The method 100 proceeds to block 104 by forming at least one trench 270 in the backside 212 of the semiconductor substrate 210. The openings 262 of the patterned hard mask layer 260 are etched further into the semiconductor substrate 210 to form the trenches 270, for example by using a dry etching process. Herein, the patterned hard mask layer 260 serves as a protective mask during the etching process. In some embodiments of the present disclosure, the trenches 270 extend from the backside 214 towards the radiation-sensing region 220 and extend into the radiation-sensing region 220, such that the radiation-sensing region 220 is divided into plural regions.

In FIG. 2C, a cross-section area of the trench 270 adjacent to the backside 214 of the semiconductor substrate 210 is greater than a cross-section area of the trench 270 adjacent to the frontside 212 of the semiconductor substrate 210e. The trenches 270 have trapezoidal shapes having inclined sidewalls 272 and a bottom edge 274 in the figure, but various embodiments of the present disclosure are not limited in this regards. In alternative embodiments, the trenches 270 may have approximately rectangular shapes, triangular shapes, or other suitable shapes. In some embodiments, a cross-section of the trenches 270 narrows from the backside 214 towards the radiation-sensing region 220. Herein, at least one of the trench 270 has a depth that is in a range from approximately 0.25 micrometers to approximately 4 micrometers.

Figure 2D:
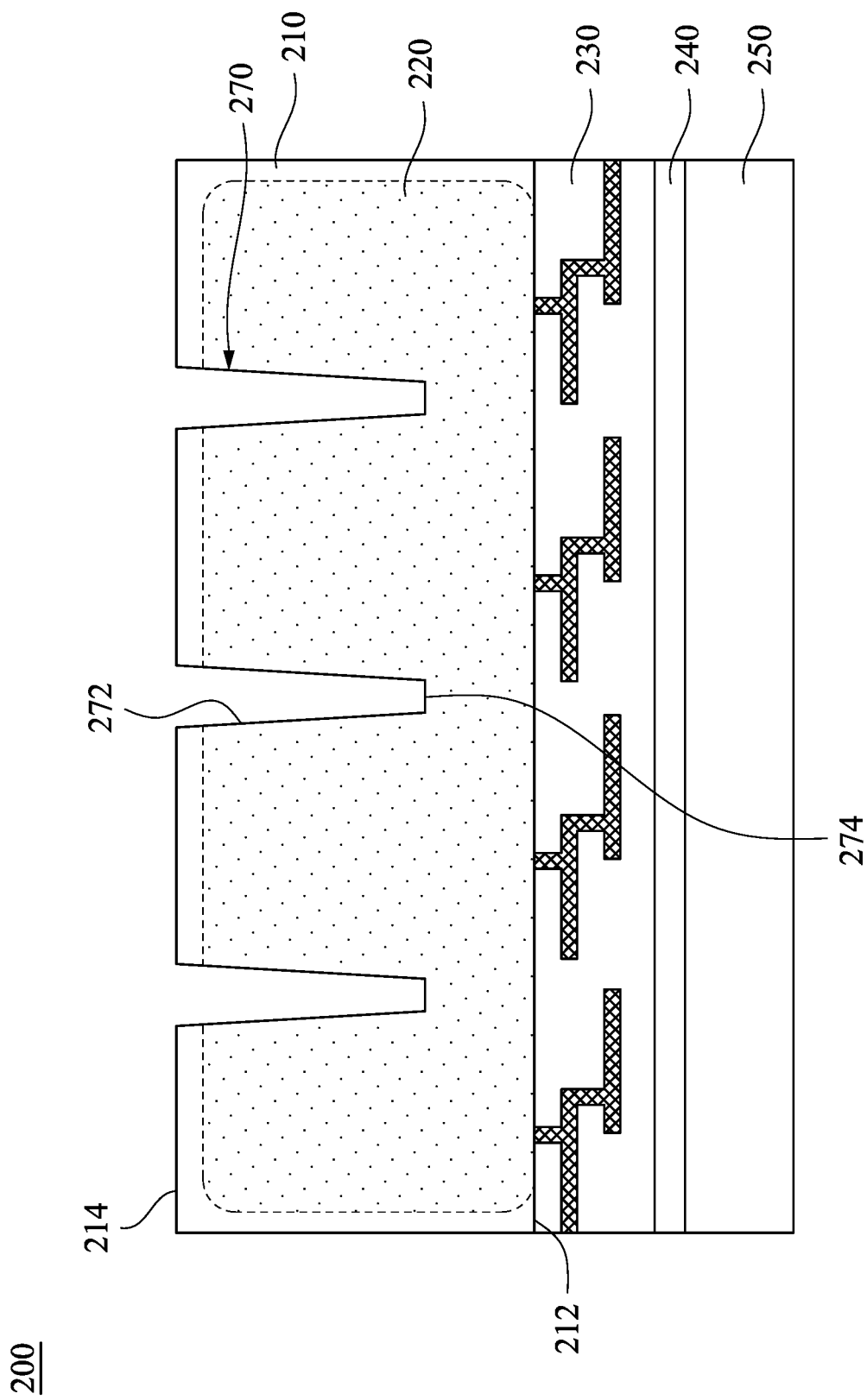

Reference is made to FIG. 1 and FIG. 2D. After the formation of the trenches 270, the patterned hard mask layer 260 is removed. As shown in FIG. 2D, the backside 214 of the semiconductor substrate 210 and the sidewall 272 and the bottom edge 274 of the trench 270 are uncovered. That is, in some embodiments of the present disclosure, the back surface of semiconductor substrate 210 is exposed, which is prepared for the next implantation step.

Figure 2E:
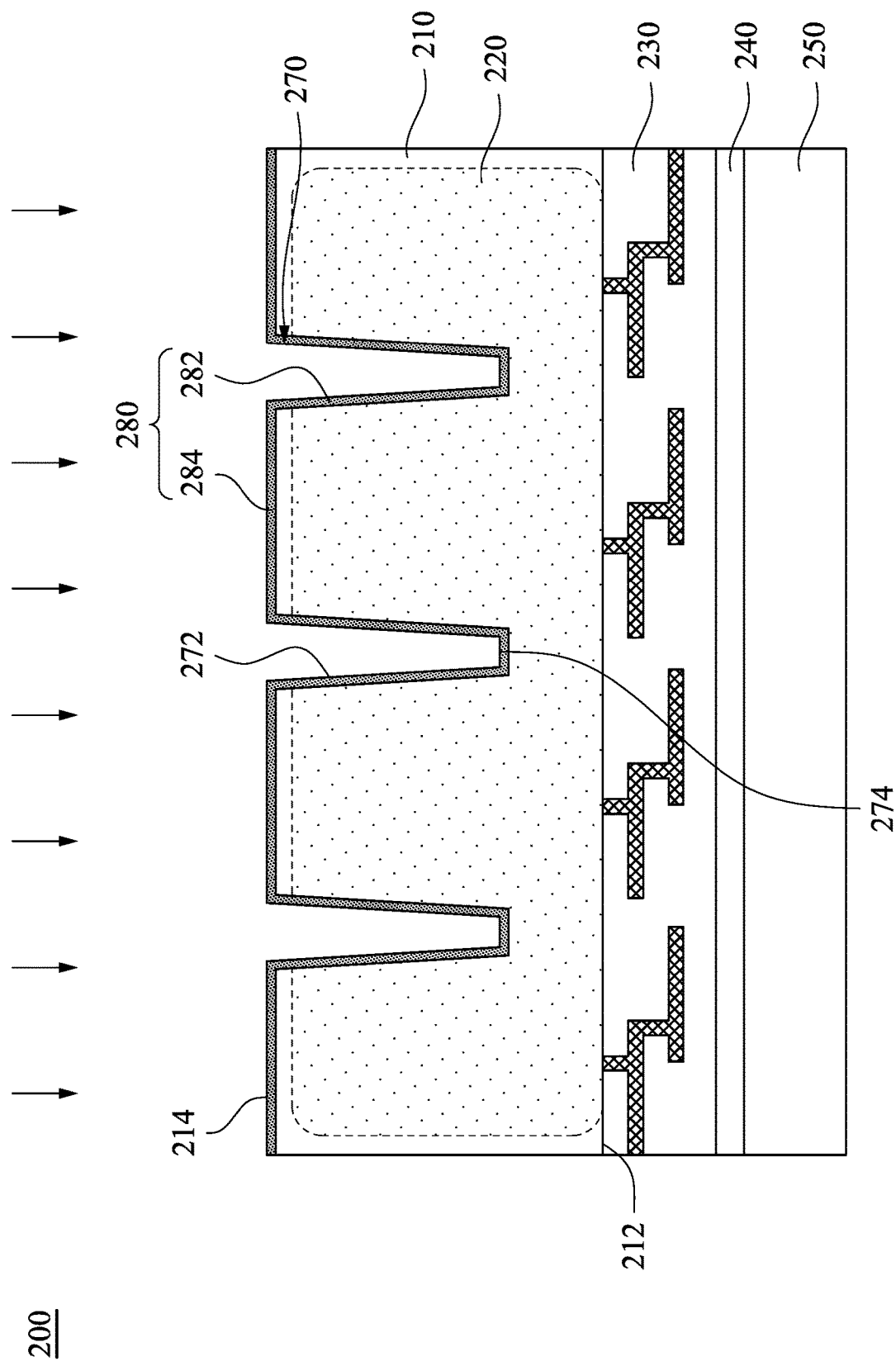

Reference is made to FIG. 1 and FIG. 2E. The method 100 proceeds to the step 106 by implanting second dopants from the backside 214 into the semiconductor substrate 210 to form a passivation layer 280. In some embodiments of the present disclosure, the implantation process is performed without the use of a mask, and the second dopants are implanted into the overall backside 214 of the semiconductor substrate 210.

To be specific, some of the second dopants are implanted through the inclined sidewall 272 and the bottom edge 274 of the trenches 270 to form first portions 282 of the passivation layer 280, in which the first portions 282 of the passivation layer 280 conforms to the trenches 270. The other of the second dopants are implanted through the backside 212 of the semiconductor substrate 210 to form second portions 284 of the passivation layer 280, in which the second portions 284 of the passivation layer 280 may have a flat profile as the back surface of the semiconductor substrate 210 does. The first portion 282 and the second portion 284 of the passivation layer 280 are formed simultaneously and consecutively.

In some embodiments of the present disclosure, the trenches 270 having the inclined sidewalls 272 may receives the second dopants well when the implantation process is performed in a direction normal to the back surface of the semiconductor substrate 210. In some embodiments, the implantation process may be performed with a tilt angle, while the sidewalls 272 of the trenches 270 are both inclined correspondingly so as to receive the second dopants well. However, various embodiments of the present disclosure are not limited in this regard, a plasma diffusion process involves a plasma-immersion ion implantation may also be adopted, and the passivation layer 280 may be formed on vertical sidewalls of the trenches (not shown) when the trenches have rectangular shapes.

Since the implantation for forming the passivation layer 280 are performed from the backside 214, the implantation damage to the radiation-sensing region 220 in the semiconductor substrate 210, which occurs at a frontside implantation process, may be eliminated. Herein, the doping polarity of the passivation layer 280 are opposite from the doping polarity of the radiation-sensing region 220. That is, the second dopants of the passivation layer 280 are of an opposite type to that of the first dopants of the radiation-sensing region 220.

Herein, the position or location of the passivation layer 280 may be adjusted by tuning an implantation energy level of the implantation process. For example, a smaller implantation energy level causes the radiation-sensing region 220 to be closer to the inclined sidewall 272 and the bottom edge 274 of the trenches 270 and the backside 214 of the semiconductor substrate 210. Through the process, the passivation layer 280 may be connected to the inclined sidewall 272 and the bottom edge 274 of the trenches 270 and the backside 214 of the semiconductor substrate 210. Alternatively, a higher implantation energy level results in a deeper implant, which means the passivation layer 280 are formed further away from the inclined sidewall 272 and the bottom edge 274 of the trenches 270 and the backside 214 of the semiconductor substrate 210. Though the process, the passivation layer 280 may be disconnected from the inclined sidewall 272 and the bottom edge 274 of the trenches 270 and the backside 214 of the semiconductor substrate 210.

In some embodiments of the present disclosure, the implantation may achieve a dopant depth in a range from about 10 nanometers to about 2.5 micrometers, and a dosage range in a range from about 1 E11 ions/cm$^2$ to about 1 E13 ions/cm$^2$. As a result of the implantation, the passivation layer 280 is formed around the trenches 270 and the backside 214 of the semiconductor substrate 210.

Processes (such as etching processes) used to form the trenches 270 may result in defects (such as dangling bonds) on the surfaces of the trenches 270 (such as the sidewalls 272). These defects may be physical defects or electrical defects and could trap carriers such as electrons. The trapped carriers may produce leakage current. Leakage current is problematic for semiconductor devices, such as photosensitive devices. With a sufficient amount of leakage current, radiation-detection regions (not formed yet at this stage of fabrication) may falsely detect "light", even when the semiconductor device is placed in an optically dark environment. Alternatively stated, the semiconductor device may end up "sensing" light when it shouldn't have (since there is actually no light). In this situation, the leakage current may be referred to as a "dark current". Dark currents are formed from electrical cross-talk and bring degradation in the performance of the semiconductor device. Therefore, the dark currents are undesirable.

Here, the passivation layer 280 substantially seals off these defects on the surfaces of the trenches 270. The sealed-off defects are not able to move around freely, and thus will be much less likely to cause leakage current. As such, the passivation layer 280 helps eliminate the dark current and therefore reduce electrical cross-talk.

Figure 2F:
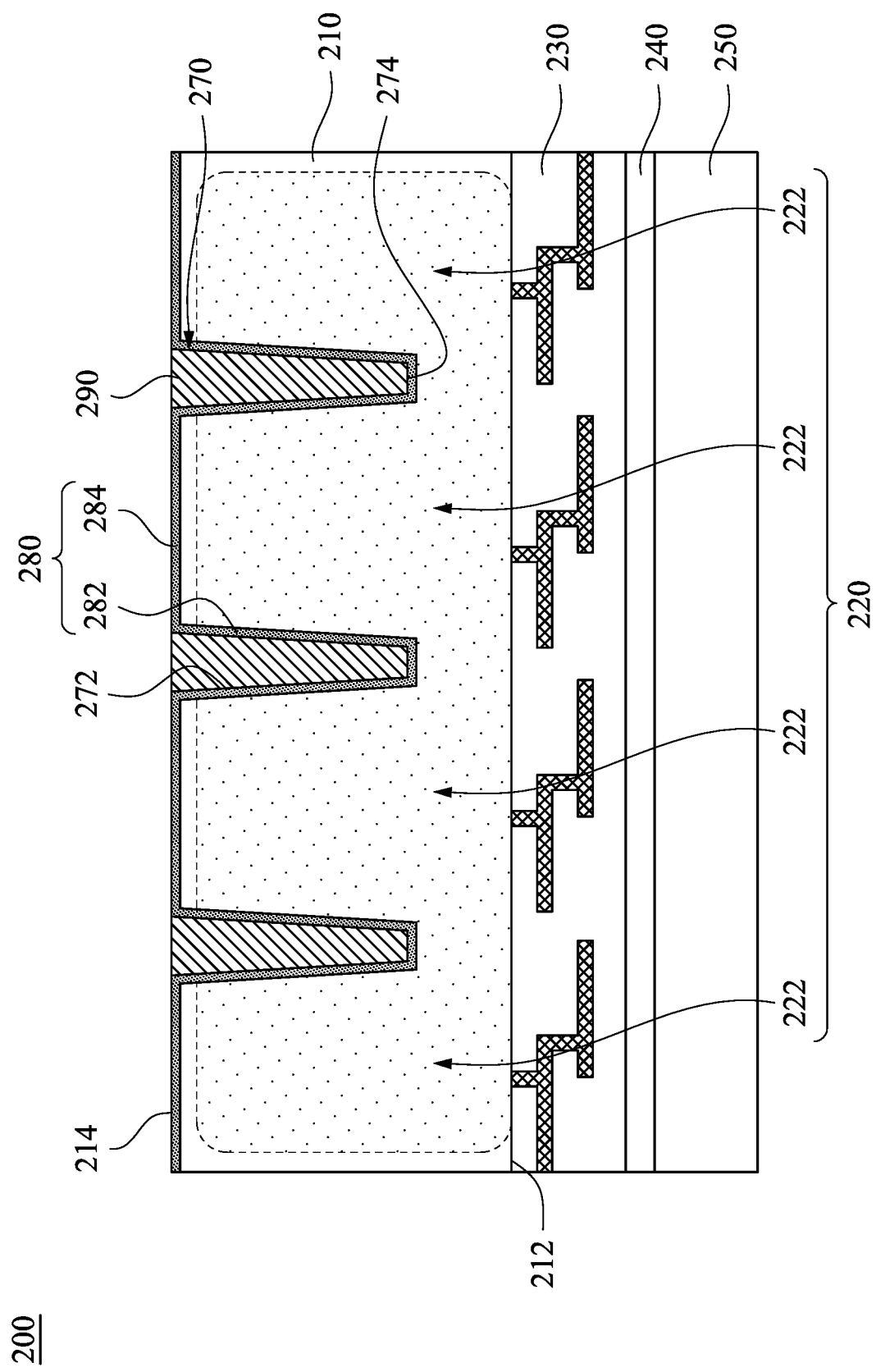

Referring now to FIG. 2F, the trenches 270 are filled with a dielectric material to form trench isolation features 290, respectively. The trench isolation features 290 are formed by depositing a dielectric material (such as an oxide material or a nitride material) from the backside 214 into the trenches 270, and thereafter removing the portions of the dielectric material outside the trenches 270 with a chemical-mechanical polishing (CMP) process. In some embodiments, the trench isolation features 290 may be made of high-k dielectric material, such as $Al_2O_3$, $ZrO_2$, barium strontium titanate (BST), lead zirconate titanate (PZT), $ZrSiO_2$, $HfSiO_2$, HfSiON, $TaO_2$, or the like.

Herein, the trench isolation features 290 define plural radiation-sensing regions 222 in the radiation-sensing region 220. The radiation-sensing regions 222 are operable to sense or detect radiation waves projected toward the radiation-sensing regions 222 through the backside 214 of the semiconductor substrate 210. The radiation-sensing regions 222 may be able to sense or detect radiation having specific wavelengths, which may correspond to lights of different colors. In some embodiments, the radiation-sensing regions 222 include a photodiode. In other embodiments, the radiation-sensing regions 222 may include other types of photodiodes, photogates, reset transistors, source follower transistors, or transfer transistors. For the sake of simplicity, the structural details of the radiation-sensing regions 222 are not illustrated.

In some embodiments of the present disclosure, a semiconductor device 200 is obtained. The semiconductor device 200 includes the semiconductor substrate 210, the radiation-sensing region 220, the trenches 270, the passivation layer 280, and trench isolation features 290. The radiation-sensing region 220 is formed adjacent to the frontside 212. The trenches 270 have inclined sidewalls 272 and a bottom edge 274, in which the trenches 270 extend from the backside 214 towards the radiation-sensing region 220. The passivation layer 280 is formed adjacent the backside 214 of the semiconductor substrate 210 and the inclined sidewalls 272 and the bottom edge 274 of the trench 270, in which the passivation layer 280 conforms to the trench 270. The trench isolation features 290 are formed in the trenches 270. The trench isolation features 290 define plural radiation-sensing regions 222 of the radiation-sensing region 220. The passivation layer 280 may be connected to the trench isolation features 290.

In the present embodiments of the present disclosure, since the trench isolation features 290 are formed after the formation of the passivation layer 280, the distance between one of the radiation-sensing regions 222 of the radiation-sensing region 220 and the trench isolation features 290 are reduced. Though the reduced distance, the radiation-sensing regions 222 in the semiconductor device 200 have a great size, and therefore can enhance the full well capacity (FWC).

In some embodiments, the semiconductor device 200 further includes the interconnect structure 230, the buffer layer 240, and the carrier substrate 250. The interconnect structure 230 is formed on the frontside 212 of the semiconductor substrate 210. The buffer layer 240 is formed on the interconnect structure 230. The carrier substrate 250 is bonded with the buffer layer 250. The function and the detail configuration have been illustrated previously, and thereto not repeated herein.

Figure 3:
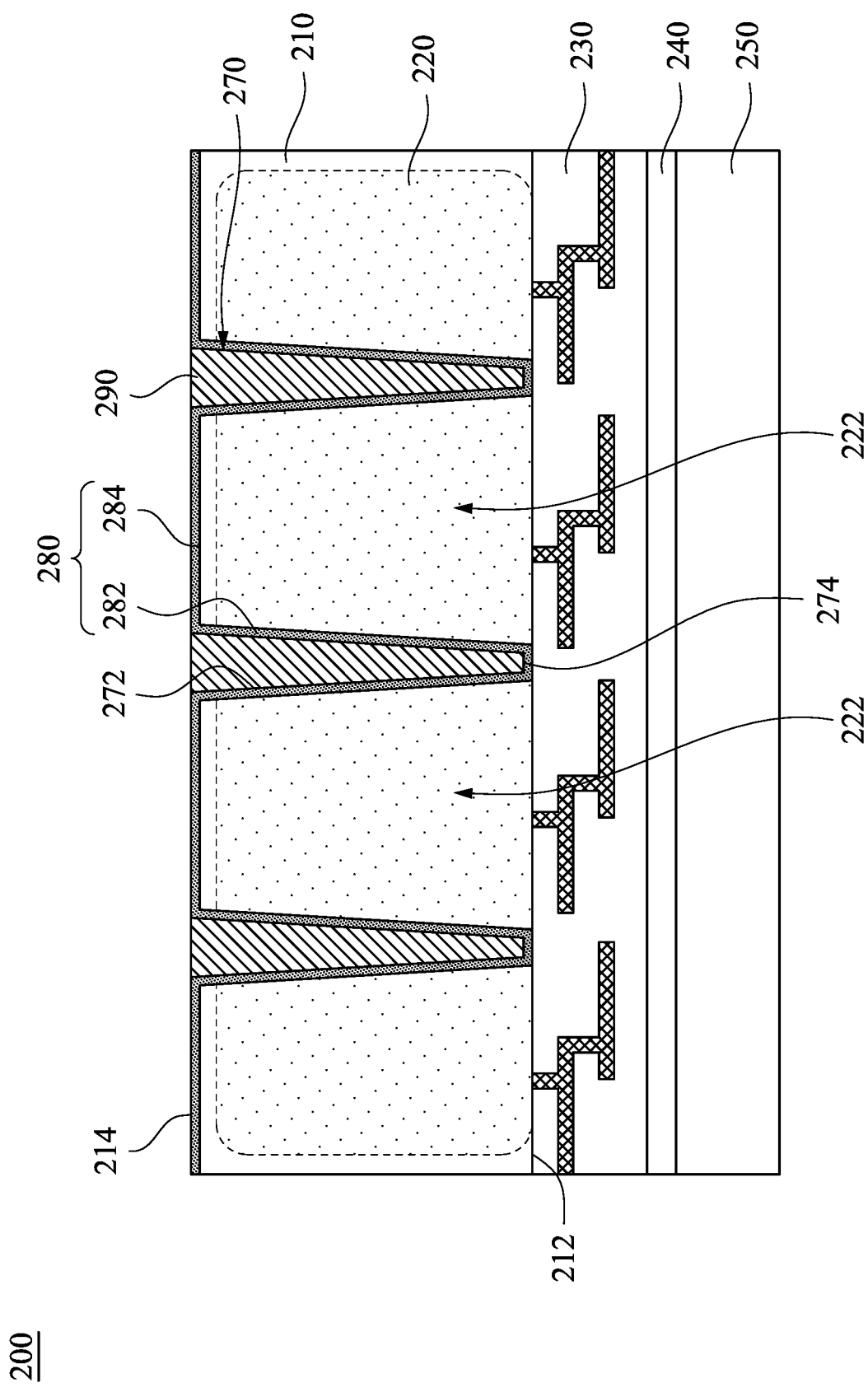
FIG. 3 is a cross-sectional view of a semiconductor device according to some embodiments of the present disclosure.

FIG. 3 is a cross-sectional view of a semiconductor device 200 according to some embodiments of the present disclosure. The present embodiments are similar to the embodiments of FIG. 2F, but at least one of the differences between the present embodiments and the embodiments of FIG. 2F is that a back deep trench isolation (BDTI) structure is adopted in the present embodiments. As shown in figure, at least one of the trench isolation feature 290 extends from the backside 214 towards the radiation-sensing region 220 and penetrates through the radiation-sensing region 220, such that the radiation-sensing region 220 is divided into the plural radiation-sensing regions 222.

The fabrication process of the semiconductor device 200 of the present embodiments is substantially the same as that of the embodiments of FIG. 2F, and the difference is that the trenches 270 are formed deeper than that of the previous embodiments, to penetrate through the radiation-sensing region 220 (refereeing to FIG. 2C). The passivation layer 280 and the trench isolation features 290 formed subsequently have shapes conforming to the deeper trenches 270, such that the trench isolation features 290 define the radiation-sensing regions 222. In furtherance of some embodiments of the present disclosure, the passivation layer 280 formed on the bottom edge 274 of the trench 270 may reach the frontside 212, such that the semiconductor substrate 210 and the radiation-sensing region 220 are divided into plural disconnected pieces in the cross-sectional view. In some other embodiments, the trenches 270 may be extended and reach the frontside 212, and the passivation layer 280 may be formed on the sidewalls 272 but not the bottom edge 274 of the trench 270.

Other details of the present embodiments are substantially the same as the embodiments of FIG. 2F, and thereto not repeated herein.

In the embodiments of the present disclosure, the passivation layer are formed on the sidewall and the bottom edge of the trench isolation features and the backside of the substrate. Though the process, no extra mask for forming the passivation layer is needed. Since the implantation for forming the passivation layer is performed from the backside, the implantation damage to the substrate may be eliminated. In addition, the radiation-sensing regions have a great size to keep the full well capacity. The semiconductor device having deep trench isolation features may also be manufactured by the methods of the present embodiments.

According to some embodiments of the present disclosure, a semiconductor device includes a semiconductor substrate, a radiation-sensing region, at least one isolation structure, and a doped passivation layer. The radiation-sensing region is present in the semiconductor substrate. The isolation structure is present in the semiconductor substrate and adjacent to the radiation-sensing region. The doped passivation layer at least partially surrounds the isolation structure in a substantially conformal manner.

According to some embodiments of the present disclosure, a semiconductor substrate, a radiation-sensing region, at least one dielectric material, and a doped passivation layer. The semiconductor substrate has at least one trench therein. The radiation-sensing region is present in the semiconductor substrate. The dielectric material is present in the trench of the semiconductor substrate. The doped passivation layer is present at least in and at least substantially conforming to at least one sidewall of the trench.

According to some embodiments of the present disclosure, a method for forming a semiconductor device includes forming at least one radiation-sensing region in a semiconductor substrate; forming at least one trench in a backside of the semiconductor substrate and adjacent to the radiation-sensing region; and implanting a first dopant into the semiconductor substrate from the backside of the semiconductor substrate after the forming the trench.

According to some embodiments of the present disclosure, a method includes forming a radiation-sensing region in a semiconductor substrate. The radiation-sensing region includes a doped region of the semiconductor substrate having first dopants. A first surface of the radiation-sensing region is level with a first surface of the semiconductor substrate. A second surface of the radiation-sensing region is spaced apart from a second surface of the semiconductor substrate. The second surface of the semiconductor substrate is opposite to the first surface of the semiconductor substrate. The second surface of the radiation-sensing region is opposite to the first surface of the radiation-sensing region. An interconnect structure is formed in physical contact with the first surface of the radiation-sensing region. A trench is formed in the semiconductor substrate. The trench extends from the second surface of the semiconductor substrate into the radiation-sensing region. A passivation layer is formed along sidewalls and a bottom of the trench. The passivation layer includes a doped region of the radiation-sensing region having second dopants. The first dopants and the second dopants are of opposite types. An isolation structure is formed in the trench.

According to some embodiments of the present disclosure, a method includes doping a semiconductor substrate to form a radiation-sensing region in the semiconductor substrate. A first surface of the radiation-sensing region is level with a first surface of the semiconductor substrate. An interconnect structure is formed in physical contact with the first surface of the semiconductor substrate. The semiconductor substrate is patterned to form a trench. The trench extends from a second surface of the semiconductor substrate into the radiation-sensing region. The second surface of the semiconductor substrate is opposite to the first surface of the semiconductor substrate. A portion of the radiation-sensing region exposed by sidewalls and a bottom of the trench is doped to form a passivation layer along the sidewalls and the bottom of the trench. The passivation layer and the radiation-sensing region have dopants of opposite types. A dielectric material is deposited in the trench.

According to some embodiments of the present disclosure, a method includes implanting first dopants into a first side of a semiconductor substrate to form a radiation-sensing region in the semiconductor substrate. An interconnect structure is formed on the first side of the semiconductor substrate. A second side of the semiconductor substrate is etched to form a trench in the semiconductor substrate. The trench extends into the radiation-sensing region. The second side of the semiconductor substrate is opposite to the first side of the semiconductor substrate. Second dopants are implanted into sidewalls and a bottom of the trench. The first dopants and the second dopants are of opposite types. The trench is filled with a dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a radiation-sensing region in a semiconductor substrate, the radiation-sensing region comprising a doped region of the semiconductor substrate having first dopants, a first surface of the radiation-sensing region being level with a first surface of the semiconductor substrate, a second surface of the radiation-sensing region being spaced apart from a second surface of the semiconductor substrate, the second surface of the semiconductor substrate being opposite to the first surface of the semiconductor substrate, the second surface of the radiation-sensing region being opposite to the first surface of the radiation-sensing region;
    forming an interconnect structure in physical contact with the first surface of the radiation-sensing region;
    forming a trench in the semiconductor substrate, the trench extending from the second surface of the semiconductor substrate into the radiation-sensing region;
    forming a passivation layer along sidewalls and a bottom of the trench, the passivation layer comprising a doped region of the radiation-sensing region having second dopants, the first dopants and the second dopants being of opposite types; and
    forming an isolation structure in the trench.

2. The method of claim 1, wherein forming the radiation-sensing region in the semiconductor substrate comprises implanting the first dopants into the semiconductor substrate.

3. The method of claim 1, wherein forming the passivation layer along the sidewalls and the bottom of the trench comprises implanting the second dopants into the sidewalls and the bottom of the trench.

4. The method of claim 1, wherein forming the trench in the semiconductor substrate comprises performing a dry etching process on the semiconductor substrate.

5. The method of claim 1, further comprising, before forming the trench in the semiconductor substrate, performing a thinning process on the semiconductor substrate.

6. The method of claim 1, wherein the trench exposes a dielectric material of the interconnect structure.

7. The method of claim 1, wherein a portion of the passivation layer extends along the second surface of the semiconductor substrate.

8. A method comprising:
    doping a semiconductor substrate to form a radiation-sensing region in the semiconductor substrate, a first surface of the radiation-sensing region being level with a first surface of the semiconductor substrate;
    forming an interconnect structure in physical contact with the first surface of the semiconductor substrate;
    patterning the semiconductor substrate to form a trench, the trench extending from a second surface of the semiconductor substrate into the radiation-sensing region, the second surface of the semiconductor substrate being opposite to the first surface of the semiconductor substrate;
    doping a portion of the radiation-sensing region exposed by sidewalls and a bottom of the trench to form a passivation layer along the sidewalls and the bottom of the trench, the passivation layer and the radiation-sensing region having dopants of opposite types; and
    depositing a dielectric material in the trench.

9. The method of claim 8, further comprising performing a polishing process on the dielectric material, wherein an exposed surface of the dielectric material is substantially level with an exposed surface of the passivation layer after performing the polishing process.

10. The method of claim 8, wherein a width of the trench decreases as the trench extends from the second surface of the semiconductor substrate into the radiation-sensing region.

11. The method of claim 8, wherein the bottom of the trench is spaced apart from the first surface of the semiconductor substrate.

12. The method of claim 8, wherein a portion of the passivation layer is in physical contact with the interconnect structure.

13. The method of claim 8, wherein the dielectric material is a high-k dielectric material.

14. The method of claim 8, wherein a depth of the trench is in a range from approximately 0.25 μm to approximately 4 μm.

15. A method comprising:
   implanting first dopants into a first side of a semiconductor substrate to form a radiation-sensing region in the semiconductor substrate;
   forming an interconnect structure on the first side of the semiconductor substrate;
   etching a second side of the semiconductor substrate to form a trench in the semiconductor substrate, the trench extending into the radiation-sensing region, the second side of the semiconductor substrate being opposite to the first side of the semiconductor substrate;
   implanting second dopants into sidewalls and a bottom of the trench, the first dopants and the second dopants being of opposite types; and
   filling the trench with a dielectric material.

16. The method of claim 15, wherein implanting the second dopants into the sidewalls and the bottom of the trench is performed without using a mask.

17. The method of claim 15, wherein a dosage of the second dopants is in a range from about 1E11 ions/cm$^2$ to about 1E13 ions/cm$^2$.

18. The method of claim 15, wherein an implantation depth of the second dopants is in a range from about 10 nm to about 2.5 μm.

19. The method of claim 15, wherein implanting the second dopants into the sidewalls and the bottom of the trench comprises performing a plasma-immersion ion implantation process.

20. The method of claim 15, further comprising, before etching the second side of the semiconductor substrate to form the trench in the semiconductor substrate, thinning the second side of the semiconductor substrate.

* * * * *